United States Patent
Nanataki et al.

(10) Patent No.: US 7,126,254 B2
(45) Date of Patent: Oct. 24, 2006

(54) ACTUATOR ELEMENT AND DEVICE INCLUDING THE ACTUATOR ELEMENT

(75) Inventors: Tsutomu Nanataki, Toyoake (JP); Koji Kimura, Nagoya (JP); Natsumi Shimogawa, Nagoya (JP); Hisanori Yamamoto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/881,328

(22) Filed: Jun. 30, 2004

(65) Prior Publication Data

US 2005/0057120 A1 Mar. 17, 2005

(30) Foreign Application Priority Data

Jul. 22, 2003 (JP) ............................... 2003-277887
Dec. 11, 2003 (JP) ............................... 2003-413693

(51) Int. Cl.
*H01L 41/04* (2006.01)
*H01L 41/08* (2006.01)

(52) U.S. Cl. ..................... 310/324; 310/330; 310/331; 310/332

(58) Field of Classification Search ................ 310/324, 310/330–332; 313/269, 508; 367/163
See application file for complete search history.

(56) References Cited

U.S. PATENT DOCUMENTS

| | | | |
|---|---|---|---|
| 5,233,256 A | | 8/1993 | Hayashi et al. |
| 5,266,964 A | * | 11/1993 | Takahashi et al. ............. 347/72 |
| 5,517,076 A | * | 5/1996 | Takeuchi et al. ............. 310/358 |
| 5,545,461 A | * | 8/1996 | Takeuchi et al. ............. 428/138 |
| 5,594,292 A | * | 1/1997 | Takeuchi et al. ............. 310/324 |
| 5,600,197 A | * | 2/1997 | Takeuchi et al. ............. 310/328 |
| 5,634,999 A | * | 6/1997 | Takeuchi et al. ............. 156/89.11 |
| 5,709,802 A | | 1/1998 | Furuhata et al. ............. 216/2 |
| 5,733,670 A | * | 3/1998 | Takeuchi et al. ............. 156/89.12 |
| 5,771,321 A | | 6/1998 | Stern ............................. 385/31 |
| 5,862,275 A | | 1/1999 | Takeuchi et al. ............. 385/19 |
| 5,867,302 A | | 2/1999 | Fleming ....................... 310/331 |
| 5,953,469 A | | 9/1999 | Zhou ............................ 385/22 |
| 6,028,978 A | | 2/2000 | Takeuchi et al. ............. 359/291 |
| 6,174,051 B1 | | 1/2001 | Sakaida |
| 6,265,811 B1 | | 7/2001 | Takeuchi et al. ............. 310/330 |
| 6,291,932 B1 | | 9/2001 | Maruyama et al. |
| 6,347,441 B1 | * | 2/2002 | Yun et al. ................... 29/25.35 |

(Continued)

FOREIGN PATENT DOCUMENTS

DE            4202650            8/1992

(Continued)

OTHER PUBLICATIONS

U.S. Copending Appl. No. 10/881,328, filed Jun. 30, 2004, Takeuchi et al.

(Continued)

*Primary Examiner*—Darren Schuberg
*Assistant Examiner*—J. Aguirrechea
(74) *Attorney, Agent, or Firm*—Burr & Brown

(57) ABSTRACT

An actuator element has a plate member, a piezoelectric/electrostrictive body disposed in facing relation to the plate member, and a beam disposed between the plate member and the piezoelectric/electrostrictive body and fixing the piezoelectric/electrostrictive body to the plate member. The piezoelectric/electrostrictive body has a piezoelectric/electrostrictive layer, an upper electrode formed on a surface of the piezoelectric/electrostrictive layer which faces the plate member, and a lower electrode formed on a surface of the piezoelectric/electrostrictive layer which is opposite to the surface thereof facing the plate member. When an electric field is applied to the upper electrode and the lower electrode, a portion of the piezoelectric/electrostrictive body is displaced toward or away from the plate member.

16 Claims, 17 Drawing Sheets

U.S. PATENT DOCUMENTS

| | | |
|---|---|---|
| 6,381,381 B1 | 4/2002 | Takeda et al. ................. 385/16 |
| 6,452,583 B1* | 9/2002 | Takeuchi et al. ............. 345/108 |
| 6,470,115 B1 | 10/2002 | Yonekubo .................... 385/32 |
| 6,476,540 B1 | 11/2002 | Takeuchi et al. ............. 385/147 |
| 6,565,331 B1 | 5/2003 | Takeuchi et al. ............. 417/322 |
| 6,672,714 B1* | 1/2004 | Tanikawa et al. .............. 347/71 |
| 6,690,344 B1* | 2/2004 | Takeuchi et al. .............. 345/85 |
| 6,700,305 B1* | 3/2004 | Matsuda et al. ........ 310/323.16 |
| 6,919,667 B1 | 7/2005 | Yamaguchi et al. ......... 310/324 |
| 2001/0041489 A1 | 11/2001 | Takeuchi et al. ............... 445/24 |
| 2002/0140348 A1* | 10/2002 | Takeuchi et al. ............. 313/581 |
| 2002/0146330 A1 | 10/2002 | Takeuchi et al. ............. 417/322 |
| 2003/0020370 A1 | 1/2003 | Takeuchi et al. ............. 310/328 |
| 2003/0063368 A1 | 4/2003 | Takeuchi et al. ............. 359/290 |

FOREIGN PATENT DOCUMENTS

| | | |
|---|---|---|
| EP | 1 288 697 A2 | 3/2003 |
| EP | 1 376 710 A1 | 1/2004 |
| EP | 1375916 | 1/2004 |
| JP | 4-245488 | 9/1992 |
| JP | 7-202284 | 8/1995 |
| JP | 9-65669 | 3/1997 |
| JP | 10-58674 | 3/1998 |
| JP | 10-78549 | 3/1998 |
| JP | 2913806 | 4/1999 |
| JP | 11-252333 | 9/1999 |
| JP | 11-261121 | 9/1999 |
| JP | 11-339561 | 12/1999 |
| JP | 2000-314381 | 11/2000 |
| JP | 2001-324961 | 11/2001 |
| JP | 2003-052181 | 2/2003 |
| JP | 2003-074475 | 3/2003 |
| JP | 2003-161896 | 6/2003 |
| WO | 00/52336 | 9/2000 |
| WO | 02/84118 | 10/2002 |
| WO | 02/084751 A1 | 10/2002 |

OTHER PUBLICATIONS

U.S. Copending Appl. No. 10/896,769, filed Jul. 22, 2004, Takeuchi et al.

Written Opinion issued in International Application No. PCT/JP2004/009203 (in Japanese) mailed Nov. 2, 2004 and a Partial translation of Written Opinion issued in International Application No. PCT/JP2004/009203.

Written Opinion issued in International Application No. PCT/JP2004/009204 (in Japanese) mailed Nov. 2, 2004 and a Partial translation of Written Opinion issued in International Application No. PCT/JP2004/009204.

* cited by examiner

ACTUATOR ELEMENT AND DEVICE INCLUDING THE ACTUATOR ELEMENT

This application claims the benefit of Japanese Application No. 2003-277887, filed Jul. 22, 2003, and Japanese Application No. 2003-413693, filed Dec. 11, 2003, the entireties of which are incoporated herein by reference.

BACKGROUND OF THE INVENTION

1. Field of the Invention

The present invention relates to an actuator element for converting electric energy into mechanical energy (mechanical displacement, stress, vibration, or the like), such as a display, a relay, an actuator (an actuator of the type for generating flexural displacement, for use in a servo displacement device or the like), or the like, and for converting mechanical energy into electric energy, such as a sensor (a filter, an acceleration sensor, a shock sensor, or the like), a transformer, a microphone, a sound producing member (a speaker or the like), a vibrator, or an oscillator (for power or communication use), and a device incorporating such an actuator element.

2. Description of the Related Art

In recent years, there has been a demand in the optical and precision machining fields for displacement elements for adjusting optical path lengths and positions in the order of submicrons and detection elements for detecting a minute displacement as a change in an electric signal.

To meet such a demand, efforts are being made to develop actuators and sensors (hereinafter referred to as actuator elements) which utilize a displacement based on an inverse piezoelectric effect or an electrostrictive effect that occurs when an electric field is applied to a piezoelectric/electrostrictive material such as a ferroelectric material or the like, or a reverse phenomenon.

In the above fields, the development of actuator elements which are inexpensive, small in size, operate under low voltages, and have high-speed response is under way.

As shown in FIG. 17, a conventional actuator element 200 has a ceramic substrate 202 and piezoelectric/electrostrictive operation units 204 formed on the ceramic substrate 202.

The ceramic substrate 202 has cavities 206 providing thin-plate portions functioning as vibration plates 208. The piezoelectric/electrostrictive operation units 204 are formed on the vibration plates 208. Each of the piezoelectric/electrostrictive operation units 204 has a lower electrode 210 directly formed on the vibration plate 208, a piezoelectric/electrostrictive layer 212 formed on the lower electrode 210, and an upper electrode 214 formed on the piezoelectric/electrostrictive layer 212.

If the piezoelectric/electrostrictive layer 212 is made of a piezoelectric material, then when a voltage is applied between the upper electrode 214 and the lower electrode 210 such that the voltage has the same positive and negative values as a voltage applied to polarize the piezoelectric/electrostrictive layer 212, the piezoelectric/electrostrictive layer 212 is flexurally displaced toward the cavity 206 due to the lateral effect of an electric field induced strain (see, for example, Japanese laid-open patent publication No. 7-202284).

The above actuator element 200 employs the vibration plates 208. Though the vibration plates 208 are advantageous in that they can amplify the displacement of the piezoelectric/electrostrictive layer 212, since the cavities 206 need to be formed in the ceramic substrate 202, there are limitations on efforts to make the actuator element 200 lower in profile, lighter in weight, and lower in cost.

SUMMARY OF THE INVENTION

The present invention has been made in view of the above problems. It is an object of the present invention to provide an actuator element which is capable of producing a desired displacement without the need for a vibration plate, or increasing the dynamic range of a displacement that can be converted into an electric signal without the need for a vibration plate, and which can be lower in profile, lighter in weight, and lower in cost, and a device incorporating such an actuator element.

An actuator element according to the present invention has a plate member, a piezoelectric/electrostrictive body disposed in facing relation to the plate member, and a beam disposed between the plate member and the piezoelectric/electrostrictive body and fixing the piezoelectric/electrostrictive body to the plate member, the piezoelectric/electrostrictive body having a piezoelectric/electrostrictive layer, an upper electrode formed on a surface of the piezoelectric/electrostrictive layer which faces the plate member, and a lower electrode formed on a surface of the piezoelectric/electrostrictive layer which is opposite to the surface thereof facing the plate member, whereby when an electric field is applied to the upper electrode and the lower electrode, a portion of the piezoelectric/electrostrictive body is displaced toward or away from the plate member.

Since the actuator element does not use vibration plates, it does not need to have a ceramic substrate or the like, making itself lower in profile, lighter in weight, and lower in cost.

Though an electric field is applied to the upper electrode and the lower electrode to displace a portion of the piezoelectric/electrostrictive body toward and away from the plate member as described above, the actuator element may alternatively be used as a sensor for producing an electric signal from the upper electrode and the lower electrode by displacing a portion of the piezoelectric/electrostrictive body toward and away from the plate member.

If a region disposed between the plate member and the piezoelectric/electrostrictive body and divided by the beam serves as a drive region, then the upper electrode and the lower electrode may be formed on a portion of the piezoelectric/electrostrictive body which corresponds to the beam. When an electric field is applied to the upper electrode and the lower electrode, a portion of the piezoelectric/electrostrictive body which corresponds to the drive region is displaced away from the plate member, for example.

The upper electrode and the lower electrode may be formed on a portion of the piezoelectric/electrostrictive body which corresponds to the drive region. When an electric field is applied to the upper electrode and the lower electrode, the portion of the piezoelectric/electrostrictive body which corresponds to the drive region is displaced toward the plate member, for example.

The upper electrode and the lower electrode may be formed on a portion of the piezoelectric/electrostrictive body which corresponds to the beam and a portion of the piezoelectric/electrostrictive body which corresponds to the drive region. When an electric field is applied to the upper electrode and the lower electrode which are formed on the portion corresponding to the beam, the portion of the piezoelectric/electrostrictive body which corresponds to the drive region is displaced away from the plate member, for example. When an electric field is applied to the upper electrode and the lower electrode which are formed on the portion corresponding to the drive region, the portion of the piezoelectric/electrostrictive body which corresponds to the drive region is displaced toward the plate member, for example.

The upper electrode may be connected to the surface of the piezoelectric/electrostrictive layer on which the lower electrode is formed, through a through hole formed in the piezoelectric/electrostrictive layer. In this case, the actuator element can easily be wired to a drive circuit.

According to the present invention, the piezoelectric/electrostrictive body may comprise a laminated assembly of piezoelectric/electrostrictive layers, an upper electrode formed on a surface of the laminated assembly which faces the plate member, a lower electrode formed on a surface of the laminated assembly which is opposite to the surface thereof facing the plate member, and an intermediate electrode formed in the laminated assembly between the piezoelectric/electrostrictive layers.

In this case, the actuator element is capable of achieving a parallel-type drive mode to obtain a desired displacement without using vibration plates, or of increasing the dynamic range of a displacement that can be converted into an electric signal without the need for a vibration plate. The actuator element can be lower in profile, lighter in weight, and lower in cost.

The upper electrode, the intermediate electrode, and the lower electrode may be formed on a portion of the piezoelectric/electrostrictive body which corresponds to the beam or a portion of the piezoelectric/electrostrictive body which corresponds to the drive region. Alternatively, the upper electrode, the intermediate electrode, and the lower electrode may be formed on a portion of the piezoelectric/electrostrictive body which corresponds to the beam and a portion of the piezoelectric/electrostrictive body which corresponds to the drive region.

The upper electrode and the intermediate electrode may be connected to the surface of the laminated assembly on which the lower electrode is formed, via through holes formed in the laminated assembly. In this case, the upper electrode and the intermediate electrode formed on the laminated assembly can easily be connected (signals can easily be supplied), and can easily be wired to a drive circuit.

According to the present invention, the actuator element may further include a displacement transmitter for transmitting displacement of the piezoelectric/electrostrictive body to the plate member in a drive region disposed between the plate member and the piezoelectric/electrostrictive body and divided by the beam. Inasmuch as the displacement transmitter is disposed in the region surrounded by the beam, the thickness of the actuator element itself is not increased by the displacement transmitter. Therefore, the thickness of the actuator element solely depends on the thickness of the beam. This makes the actuator element lower in profile.

With the above arrangement, if the plate member comprises a transparent plate into which light is introduced, then at least a light scattering layer may be disposed on the displacement transmitter. In a certain drive region, displacement of the piezoelectric/electrostrictive body is transmitted to the transparent plate by the displacement transmitter. When the light scattering layer is brought into contact with the transparent plate, for example, light is emitted from the drive region. If one drive region is constructed as one pixel or a plurality of drive regions are constructed as one pixel, then the actuator element can easily be applied to a display device.

With the above arrangement, a spacer may be disposed between the plate member and the piezoelectric/electrostrictive body, and in the case where the plate member is held in contact with an upper surface of the spacer and the piezoelectric/electrostrictive body is held in contact with a lower surface of the spacer, the beam may include the spacer. Thus, the spacer itself functions as the beam.

With the above arrangement, a spacer may be disposed between the plate member and the piezoelectric/electrostrictive body, and in the case where at least one-layer film is formed between a lower surface of the spacer and the piezoelectric/electrostrictive body, the beam may include the spacer and a portion of the film directly beneath the spacer.

If the displacement transmitter is formed on the piezoelectric/electrostrictive body with the upper electrode formed thereon, at least one film (e.g., the light scattering layer) is formed on the entire surface including the displacement transmitter, the spacer is formed in a given location on the film, and the plate member is disposed on the spacer, then the spacer and a portion directly beneath the spacer often tend to be hard under pressing forces. Therefore, the portion of the film directly beneath the spacer functions as the beam in coaction with the spacer.

With the above arrangement, the beam may include a buffer layer. If the spacer is made of a hard material, and the above film is formed on the lower surface of the spacer, stresses tend to concentrate on a portion of the film (a boundary between itself and the spacer), causing the film to be broken due to repeated displacement of the piezoelectric/electrostrictive body. This drawback can be avoided by including a buffer layer in the beam.

A device using the actuator element according to the present invention as described above may be a device for converting electric energy into mechanical energy (mechanical displacement, stress, vibration, or the like), such as a display, a relay, an actuator (an actuator of the type for generating flexural displacement, for use in a servo displacement device or the like), or the like, or a device for converting mechanical energy into electric energy, such as a sensor (a filter, an acceleration sensor, a shock sensor, or the like), a transformer, a microphone, a sound producing member (a speaker or the like), a vibrator, or an oscillator (for power or communication use).

As described above, the actuator element and the device employing the actuator element according to the present invention are capable of obtaining a desired displacement without using vibration plates, or of increasing the dynamic range of a displacement that can be converted into an electric signal without the need for a vibration plate. The actuator element and the device employing the actuator element can be lower in profile, lighter in weight, and lower in cost.

The above and other objects, features, and advantages of the present invention will become more apparent from the following description of preferred embodiments in conjunction with the accompanying drawings.

DESCRIPTION OF THE PREFERRED EMBODIMENTS

Embodiments of actuator elements and a device incorporating an actuator element according to the present invention will be described below with reference to FIGS. 1 through 16.

Figure 1:
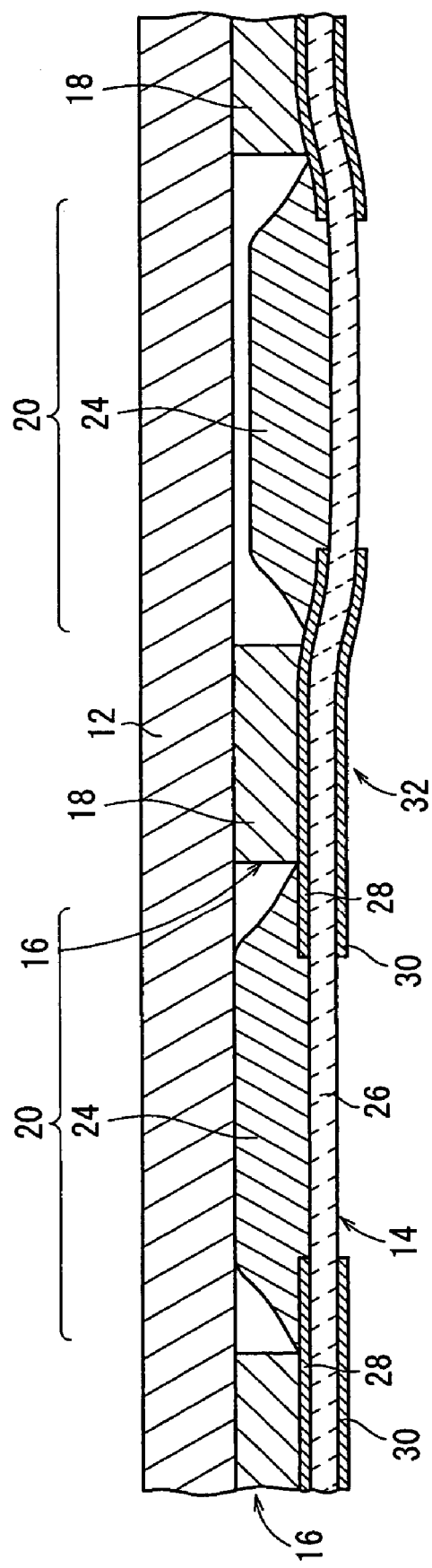
FIG. 1 is a cross-sectional view, partly omitted from illustration, of an actuator element according to a first embodiment.

As shown in FIG. 1, an actuator element 10A according to a first embodiment has a plate member 12, a piezoelectric/electrostrictive body 14 disposed in facing relation to the plate member 12, and beams 16 disposed between the piezoelectric/electrostrictive body 14 and the plate member 12 and fixing the piezoelectric/electrostrictive body 14 to the plate member 12. Each beam 16 includes a spacer 18.

Figure 3:
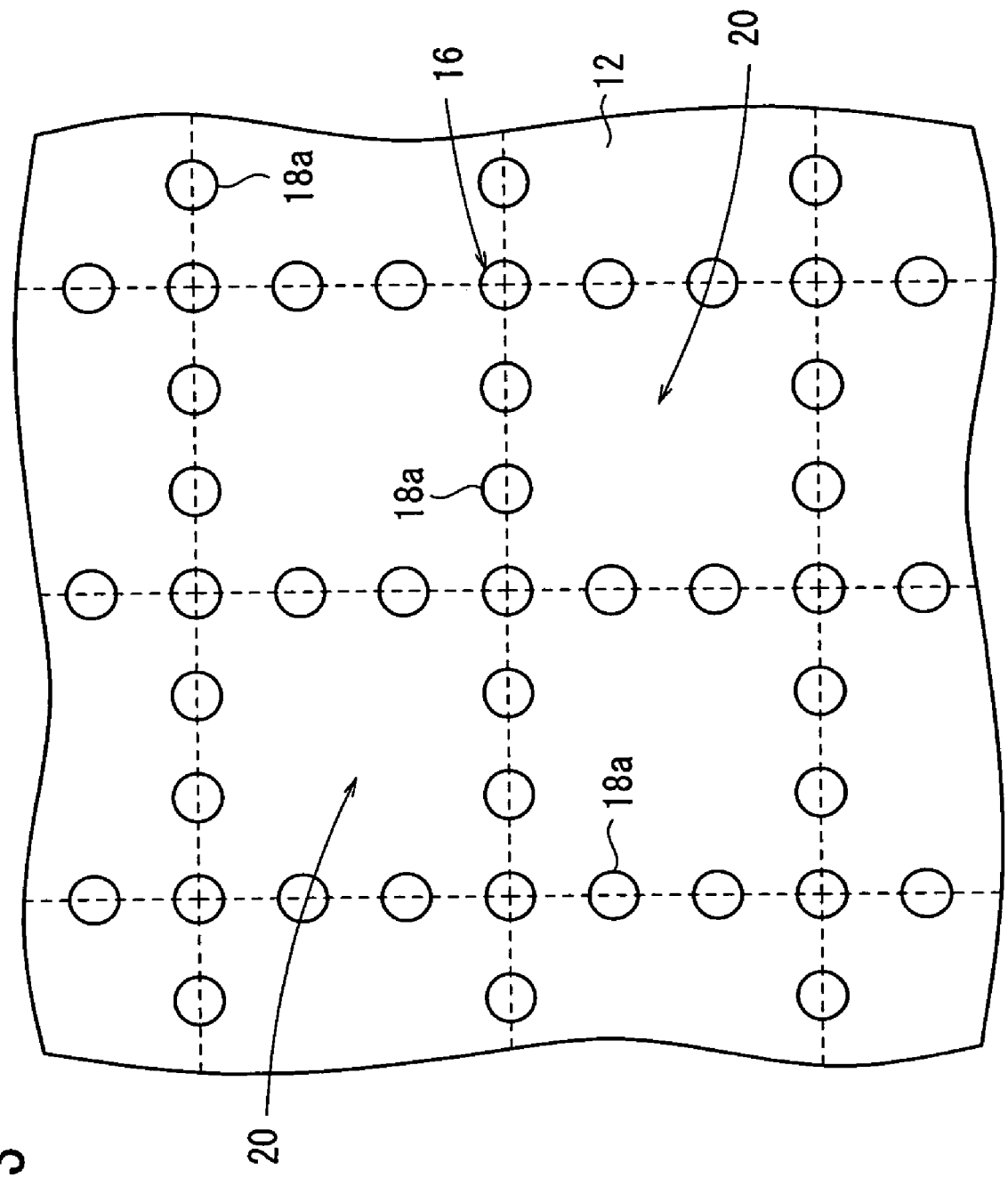
FIG. 3 is a view showing an example of the layout of spacers constituting beams, as viewed from the back of a plate member.
Figure 4:
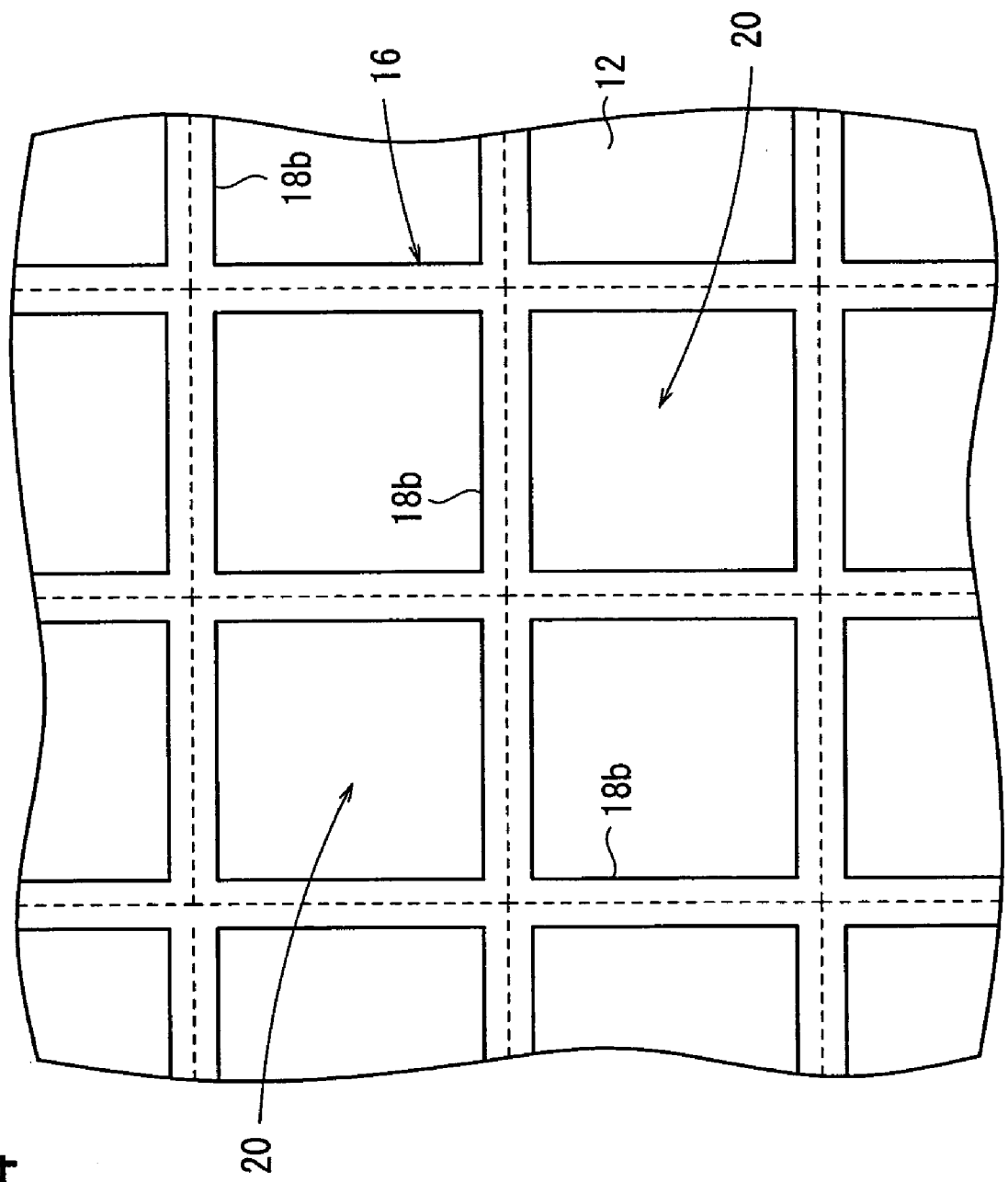
FIG. 4 is a view showing another example of the layout of spacers constituting beams, as viewed from the back of a plate member.

The spacers 18 may be a plurality of spacers 18a arranged in a grid pattern, as shown in FIG. 3, or may be a unitary spacer 18b shaped as a grid, as shown in FIG. 4.

If regions divided by the spacers 18a or the spacer 18b between the plate member 12 and the piezoelectric/electrostrictive body 14 serve as drive regions 20, as shown in FIGS. 3 and 4, then the actuator element 10A according to the first embodiment has displacement transmitters 24 formed on the upper surface of the piezoelectric/electrostrictive body 14 in association with the respective drive regions 20, as shown in FIG. 1.

Figure 2:
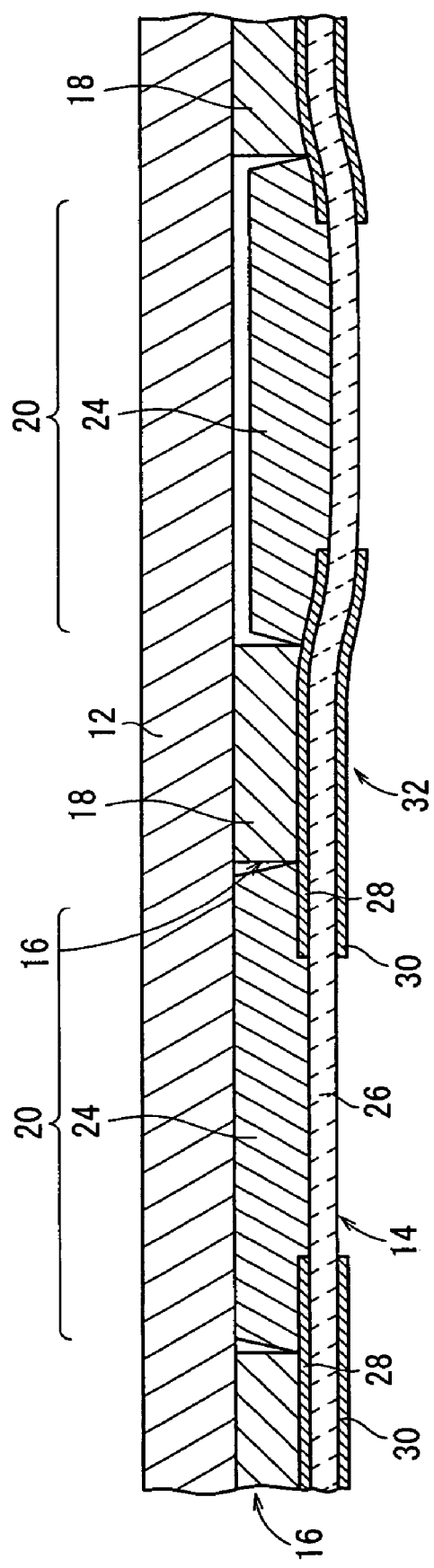
FIG. 2 is a cross-sectional view, partly omitted from illustration, showing another example of displacement transmitters.

Each of the displacement transmitters 24 may have a peripheral portion slanted gradually (the displacement transmitter 24 has a trapezoidal cross section), as shown in FIG. 1, or may have a peripheral portion slanted sharply (the displacement transmitter 24 has a rectangular cross section), as shown in FIG. 2.

Figure 6:
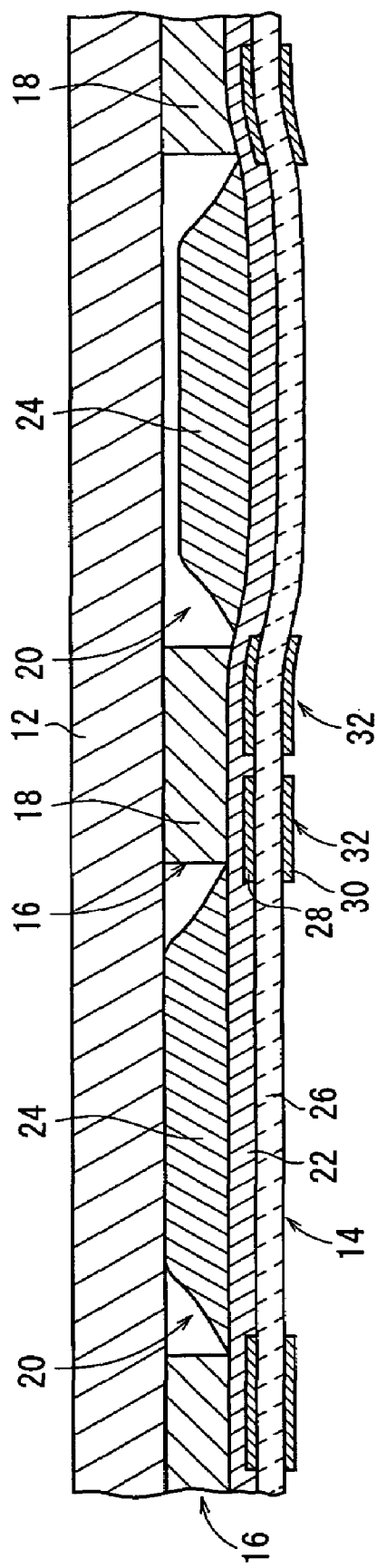
FIG. 6 is a cross-sectional view, partly omitted from illustration, showing an example in which a plurality of actuator units are provided in association with one beam, according to the first embodiment.

As shown in FIG. 6, a joining layer 22 may be formed on the entire upper surface of the piezoelectric/electrostrictive body 14, and the displacement transmitters 24 may be formed on the upper surface of the joining layer 22 in association with the respective drive regions 20. In this case, each spacer 18 has an upper surface held in contact with the plate member 12 and a lower surface held in contact with the joining layer 22. Therefore, each beam 16 includes the spacer 18 disposed between the plate member 12 and the piezoelectric/electrostrictive body 14, and a part of the joining layer 22 that is present directly beneath the spacer 18. With the joining layer 22 being formed, when the actuator element 10A is fabricated, the spacers 18 and the displacement transmitters 24 can simultaneously be bonded to the piezoelectric/electrostrictive body 14. Therefore, the process can be simplified.

The piezoelectric/electrostrictive body 14 has a single piezoelectric/electrostrictive layer 26, upper electrodes 28 formed on the upper surface (the surface facing the plate member 12) of the piezoelectric/electrostrictive layer 26, and lower electrodes 30 formed on the lower surface (the surface opposite to the surface facing the plate member 12) of the piezoelectric/electrostrictive layer 26. The upper electrodes 28 are formed in positions on the upper surface of the piezoelectric/electrostrictive layer 26 which correspond to the beams 16, and the lower electrodes 30 are formed in positions on the lower surface of the piezoelectric/electrostrictive layer 26 which correspond to the beams 16. In the piezoelectric/electrostrictive body 14 of this embodiment, one upper electrode 28, one lower electrode 30, and a portion of the piezoelectric/electrostrictive layer 26 that is sandwiched between these upper and lower electrodes 28, 30 function as one actuator unit 32.

Figure 5:
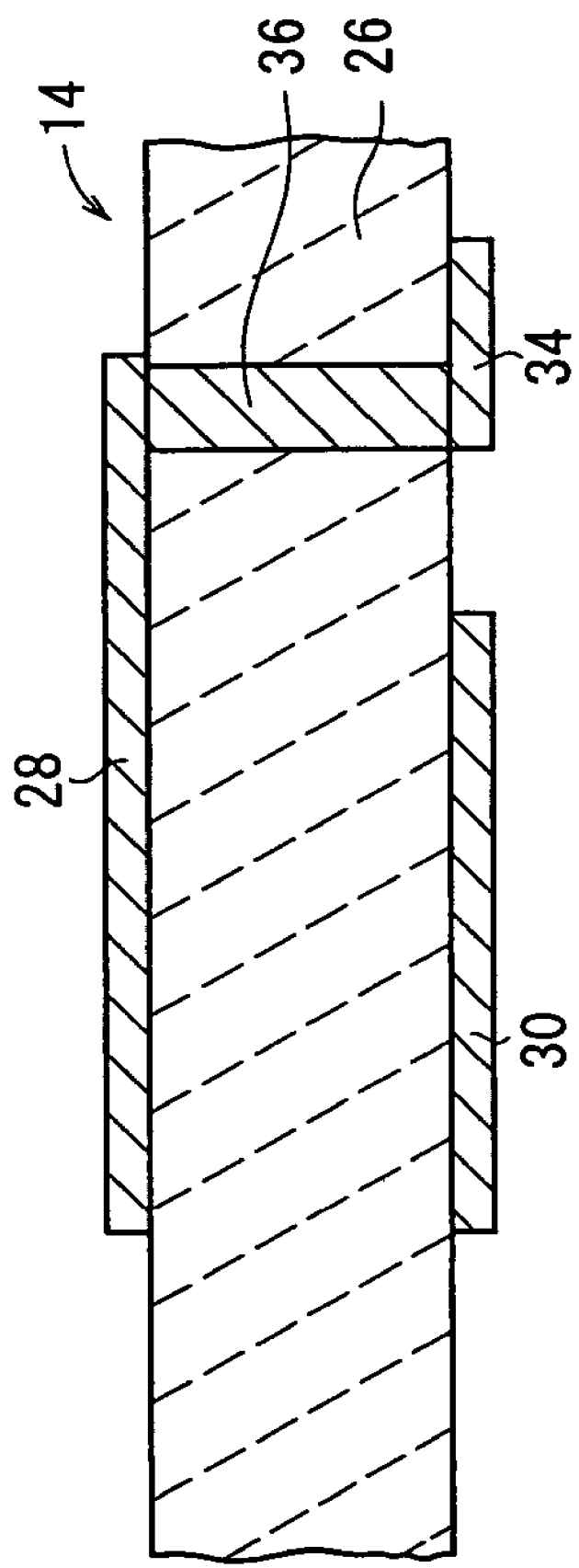
FIG. 5 is a cross-sectional view of an example of an interconnected pattern of an upper electrode and a lower electrode.

According to an interconnected pattern of the upper electrode 28 and the lower electrode 30, as shown in FIG. 5, for example, a terminal 34 for the upper electrode 28 is formed on the lower surface of the piezoelectric/electrostrictive layer 26 separately from the lower electrode 30, and the upper electrode 28 and the terminal 34 are electrically connected to each other through a through hole 36 that is formed in the piezoelectric/electrostrictive layer 26. In FIG. 5, the lower electrode 30 doubles as a terminal. Alternatively, this terminal (the terminal for the lower electrode 30) may be formed on the same surface at a position separate from the lower electrode 30.

A driving process for the actuator element 10A according to the first embodiment will be described below.

When the piezoelectric/electrostrictive body 14 is in a natural state, the upper end faces of the displacement transmitters 24 are held in contact with the lower surface of the plate member 12.

When a drive voltage of positive polarity (e.g., a voltage of +25 V, for example, with respect to the lower electrodes 30) is applied between the upper electrodes 28 and the lower electrodes 30 of the actuator units 32 that are formed around a certain drive region 20 (e.g., the right drive region 20 in FIG. 1), the peripheral portion of the drive region 20 tends to be flexurally displaced so as to be convex toward the plate member 12. However, since the flexural displacement is suppressed by the spacers 18 and the plate member 12, the energy produced at this time is transmitted to the portion of the piezoelectric/electrostrictive body 14 which corresponds to the drive region 20. Therefore, as shown in FIG. 1, that portion of the piezoelectric/electrostrictive body 14 is flexurally displaced so as to be convex downwardly, causing the upper end face of the displacement transmitter 24 in the drive region 20 to be spaced from the plate member 12.

When the application of the above drive voltage is stopped, the portion of the piezoelectric/electrostrictive body 14 which corresponds to the drive region 20 is displaced back to its original state, allowing the upper end face of the displacement transmitter 24 to contact the plate member 12 again.

According to the above driving process, a drive voltage of positive polarity is applied between the upper electrodes 28 and the lower electrodes 30 that sandwich the piezoelectric/electrostrictive layer 26 to space the upper end face of the displacement transmitter 24 from the plate member 12. Alternatively, a drive voltage of opposite polarity (e.g., a voltage of −25 V, for example, with respect to the lower electrodes 30) may be applied between the upper electrodes 28 and the lower electrodes 30, or the direction of polarization of the piezoelectric/electrostrictive layer 26 or the voltage value may be varied. In this case, the portion of the piezoelectric/electrostrictive body 14 which corresponds to the drive region 20 is displaced so as to be convex toward the plate member 12, causing the upper end face of the displacement transmitter 24 to strongly press the lower surface of the plate member 12. With a structure in which the plate member 12 and the piezoelectric/electrostrictive body 14 are spaced from each other by the spacer 18 in advance, the displacement transmitter 24 may be driven into and out of contact with the plate member 12.

Preferred constituent materials of the various components will be described below. The plate member 12 may be made of a metal, ceramics, glass, or an organic resin, but is not limited to any particular materials insofar as they are capable of the functions thereof as described above. For example, SUS304 (Young's modulus: 193 GPa, coefficient of linear expansion: $17.3 \times 10^{-6}/^\circ$ C.), SUS403 (Young's modulus: 200 GPa, coefficient of linear expansion: $10.4 \times 10^{-6}/^\circ$ C.), zirconium oxide (Young's modulus: 245.2 GPa, coefficient of linear expansion: $9.2 \times 10^{-6}/^\circ$ C.), glass (e.g., Corning 0211, Young's modulus: 74.4 GPa, coefficient of linear expansion: $7.38 \times 10^{-6}/^\circ$ C.), and acrylic sheet are preferably used.

The spacers 18 should preferably be made of a material which is not deformable with heat and pressure, e.g., thermosetting rein such as epoxy resin or the like, light curing resin, moisture curing resin, cold-setting resin, or the like which is set. The spacers 18 may be made of metal, glass, or ceramic.

A filler may be contained in the spacers 18. Each spacer 18 with a filler contained therein has higher hardness and greater heat resistance, strength, and dimensional stability than a spacer with no filler contained therein. Stated otherwise, the hardness, heat resistance, and strength of the set resin can be increased and the amount by which it thermally expands and shrinks can be greatly reduced by including a filler in each spacer 18.

The upper electrodes 28, the lower electrodes 30, and the terminals 34 are made of a metal such as aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like, or an alloy of at least two of these metals. Alternatively, the upper electrodes 28, the lower electrodes 30, and the terminals 34 may be made of a composite of the above metal or alloy and metal oxide such as aluminum oxide, titanium oxide, zirconium oxide, cerium oxide, copper oxide, or the like, or made of an electrically conductive material such as a cermet containing the metal or alloy in which the same material as the material of the piezoelectric/electrostrictive layer 26 to be described below is dispersed.

The upper electrodes 28, the lower electrodes 30, and the terminals 34 may be formed on the piezoelectric/electrostrictive layer 26 by a film forming process such as photolithography, screen printing, dipping, coating, electrophoresis, ion beam process, sputtering, vacuum evaporation, ion plating, chemical vapor deposition (CVD), plating, etc.

Preferred examples of constituent materials of the piezoelectric/electrostrictive layer 26 include lead zirconate, lead manganese tungstate, bismuth sodium titanate, bismuth ferrate, sodium potassium niobate, bismuth strontium tantalate, lead magnesium niobate, lead nickel niobate, lead zinc niobate, lead manganese niobate, lead magnesium tantalate, lead nickel tantalate, lead antimony stannate, lead titanate, barium titanate, barium copper tungstate, lead magnesium tungstate, lead cobalt niobate, or a composite oxide comprising at least two of the above compounds. These piezoelectric/electrostrictive materials may contain a solid solution of an oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper, etc.

The piezoelectric/electrostrictive layer 26 may be made of a composite piezoelectric material/composite material comprising a mixture of piezoelectric ceramic powder, piezoelectric ceramic fiber, and an organic material. Alternatively, the piezoelectric/electrostrictive layer 26 may be made of piezoelectric high polymer film (polyvinylidene fluoride (PVDF) or the like such as unoriented P (VDF-TrFE) copolymer film, uniaxially oriented P(VDF-TrFE) copolymer film, or the like). Further alternatively, the piezoelectric/electrostrictive layer 26 may be made of piezoelectric single crystal (e.g., quartz crystal, $LiNbO_3$, $LiTaO_3$, $KNbO_3$, or the like), or piezoelectric thin film (e.g., ZnO, AlN, or the like).

An antiferroelectric layer may be used in place of the piezoelectric/electrostrictive layer 26. In this case, lead zirconate, a composite oxide of lead zirconate and lead stannate, or a composite oxide of lead zirconate, lead stannate, and lead niobate may be used. These antiferroelectric materials may contain a solid solution of the above elements.

A material produced by adding lithium bismuthate, lead germanate, or the like to the above material, e.g., a material produced by adding lithium bismuthate or lead germanate to a composite oxide of lead zirconate, lead titanate, and lead magnesium niobate, is preferable because it allows the piezoelectric/electrostrictive layer 26 to be fired at a low temperature and achieve high material characteristics. The piezoelectric/electrostrictive layer 26 can also be fired at a low temperature by adding glass (e.g., silicate glass, borate glass, phosphate glass, germanate glass, or a mixture thereof). However, since excessively adding the glass would invite deterioration of material characteristics, it is desirable to determine an amount of glass to be added depending on the required characteristics.

Each displacement transmitter 24 may comprise an adhesive which may be a filler-containing adhesive. Each displacement transmitter 24 is not limited to any material, but may preferably be made of thermoplastic resin, thermosetting rein, light curing resin, moisture curing resin, cold-setting resin, or the like.

Specifically, acrylic resin, modified acrylic resin, epoxy resin, modified epoxy rein, silicone resin, modified silicone resin, vinyl acetate resin, ethylene-vinyl acetate copolymer resin, vinyl butyral resin, cyanoacrylate resin, urethane rein, polyimide resin, methacrylic resin, modified methacrylic resin, polyolefin resin, special silicone modified polymer, polycarbonate resin, natural rubber, synthetic rubber, etc. are given by way of example.

Particularly, vinyl butyral resin, acrylic resin, modified acrylic resin, epoxy resin, modified epoxy resin, or a mixture of two or more of these resins is preferable for their excellent bonding strength. Among others, epoxy resin, modified epoxy resin, or a mixture thereof is preferable.

Preferred materials and structures of the displacement transmitters 24 and a light scattering layer 108 (see FIG. 16), to be described later, are as follows: For keeping constant a natural state (a position when not driven) of a portion of the piezoelectric/electrostrictive body 14 which corresponds to the drive region 20 due to driving operation of the piezoelectric/electrostrictive body 14, the displacement transmitters 24 and the light scattering layer 108, to be described later, should preferably be of a material of reduced plastic deformation (should preferably be of a material having a high yield point). The thicknesses of the displacement transmitters 24 and the light scattering layer 108 should preferably be small. Specifically, the thickness of each of the displacement transmitters 24 and the light scattering layer 108 should preferably be 300 μm or less, or more preferably be 50 μm or less, or much more preferably be 10 μm or less.

The reasons are as follows: Upon driving operation of the piezoelectric/electrostrictive body 14 to move a portion of the piezoelectric/electrostrictive body 14 which corresponds to the drive region 20 toward and away from the plate member 12, forces are applied to the displacement transmitter 24 and the light scattering layer 108 (see FIG. 16) to cause them to extend and shrink. If forces in excess of the yield point are applied to the displacement transmitter 24 and the light scattering layer 108, then they are subjected to plastic deformation, and remain in an extended or shrunk shape. In this case, the portion of the piezoelectric/electrostrictive body 14 which corresponds to the drive region 20 tends to be in different positions in the natural state before and after the driving operation under the influence of the displacement transmitter 14 and the light scattering layer 108 which are extended or shrunk.

Since the actuator element 10A according to the first embodiment does not use vibration plates, it does not need to have a ceramic substrate or the like, making itself lower in profile, lighter in weight, and lower in cost. Particularly, because the piezoelectric/electrostrictive layer 26 included in the piezoelectric/electrostrictive body 14 is of a one-layer structure, the fabrication process can be simplified, and the actuator element can be lower in cost and profile.

In the above example, one actuator unit 32 is provided in association with one beam 16. However, as shown in FIG. 6, a plurality of actuator units 32 may be provided in association with one beam 16. In this case, even if one or two actuator units 32 are defective due to manufacturing variations, since the displacement can be compensated for by the other actuator units 32, the yield of the actuator element 10A can be increased.

As shown in FIG. 5, as each upper electrode 28 is connected to the lower surface of the piezoelectric/electrostrictive layer 26 through the through hole 36 formed in the piezoelectric/electrostrictive layer 26, the upper electrodes 28 can easily be wired to a drive circuit (not shown).

The upper electrodes 28 may be turned into a common structure or the lower electrodes 30 may be turned into a common structure. Turning the upper electrodes 28 into a common structure includes electrically connecting upper electrodes 28 or forming one upper electrode 28 on the entire upper surface of the piezoelectric/electrostrictive layer 26. Turning the lower electrodes 30 into a common structure includes electrically connecting lower electrodes 30 or forming one lower electrode 30 on the entire lower surface of the piezoelectric/electrostrictive layer 26.

By turning the upper electrodes 28 into a common structure or turning the lower electrodes 30 into a common structure, the fabrication process can be simplified, and the wiring can be facilitated. The waveform of the drive voltage can also be simplified, and the drive circuit system can be simplified. Turning the upper electrodes 28 into a common structure is more preferable than turning the lower electrodes 30 into a common structure.

It has been illustrated to apply an electric field to the upper electrodes 28 and the lower electrodes 30 to displace the displacement transmitter 24 toward and away from the plate member 12. The actuator element may alternatively be used as a sensor for producing an electric signal from the upper electrodes 28 and the lower electrodes 30 by displacing the displacement transmitter 24 toward and away from the plate member 12.

Some modifications of the actuator element 10A according to the first embodiment will be described below with reference to FIGS. 7 through 9. Those parts which correspond to those shown in FIG. 1 are denoted by identical reference characters, and will not be described overlappingly.

Figure 7:
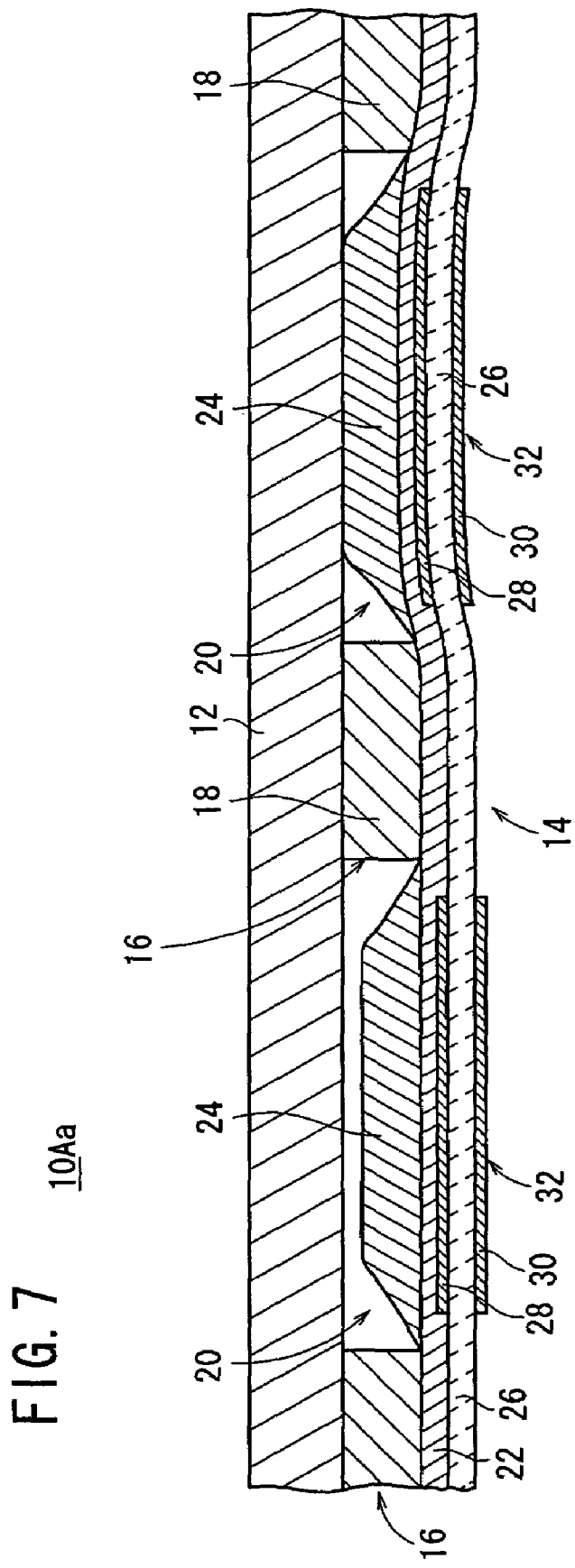
FIG. 7 is a cross-sectional view, partly omitted from illustration, showing a first modification of the actuator element according to the first embodiment.

As shown in FIG. 7, an actuator element 10Aa according to a first modification differs in that it has upper electrodes 28 and lower electrodes 30 which are formed on portions of the piezoelectric/electrostrictive body 14 which correspond to the drive regions 20.

An example of a driving process for the actuator element will be described below. While the piezoelectric/electrostrictive body 14 is in a natural state, each upper end face of the displacement transmitters 24 is spaced from the lower surface of the plate member 12.

When a drive voltage of positive polarity (e.g., a voltage of +25 V, for example, with respect to the lower electrode 30) is applied between the upper electrode 28 and the lower electrode 30 of the actuator unit 32 that corresponds to a certain drive region 20 (e.g., the right drive region 20 in FIG. 7), the actuator unit 32 that corresponds to the drive region 20 is flexurally displaced so as to be convex upwardly, as shown in FIG. 7. The driving displacement is transmitted to the displacement transmitter 24, causing the upper end face of the displacement transmitter 24 to contact the plate member 12.

When the application of the above drive voltage is stopped, the actuator unit 32 of the drive region 20 is displaced back to its original state, allowing the upper end face of the displacement transmitter 24 to be spaced from the plate member 12 again.

According to the above driving process, a drive voltage of positive polarity is applied between the upper electrode 28 and the lower electrode 30 that sandwich the piezoelectric/electrostrictive layer 26 to bring the upper end face of the displacement transmitter 24 into contact with the lower surface of the plate member 12. Alternatively, a drive voltage of opposite polarity (e.g., a voltage of −25 V, for example, with respect to the lower electrode 30) may be applied between the upper electrode 28 and the lower electrode 30, or the direction of polarization of the piezoelectric/electrostrictive layer 26 or the voltage value may be varied. In this case, the portion of the piezoelectric/electrostrictive body 14 which corresponds to the drive region 20 is flexurally displaced so as to be convex downwardly. With a structure in which the upper end face of the piezoelectric/electrostrictive body 14 is kept in contact with the lower surface of the plate member 12 in advance, the displacement transmitter 24 may be driven into and out of contact with the plate member 12.

Figure 8:
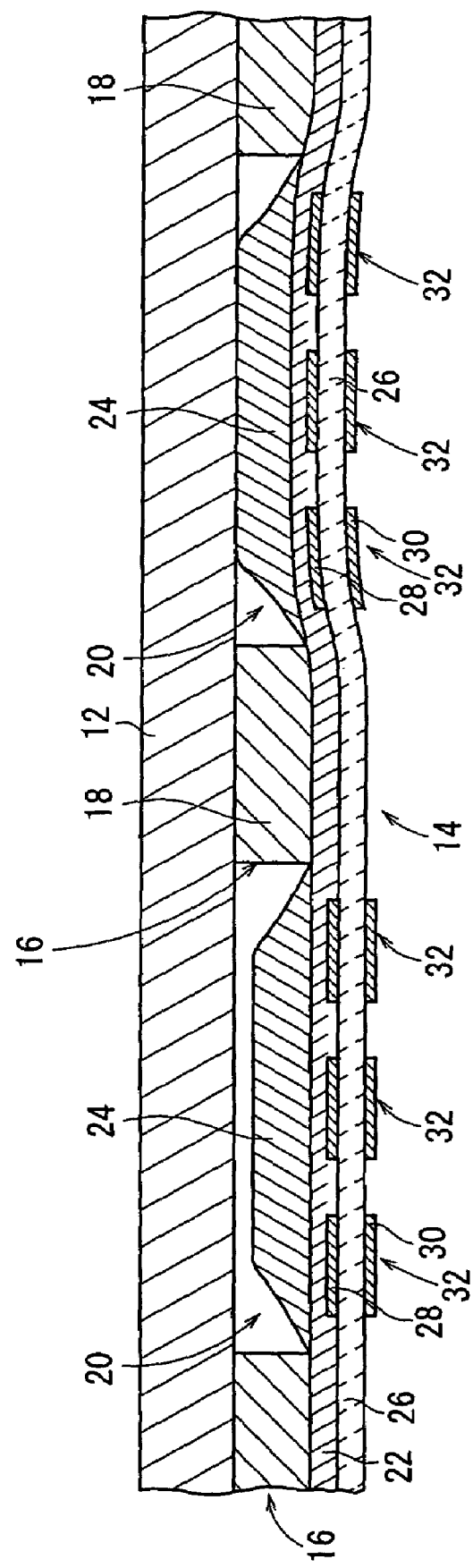
FIG. 8 is a cross-sectional view, partly omitted from illustration, showing an example in which a plurality of actuator units are provided in association with one drive region, in the first modification according to the first embodiment.

According to the first modification, as shown in FIG. 8, a plurality of actuator units 32 may be provided in association with one drive region 20. The upper electrodes 28 may be turned into a common structure or the lower electrodes 30 may be turned into a common structure.

Figure 9:
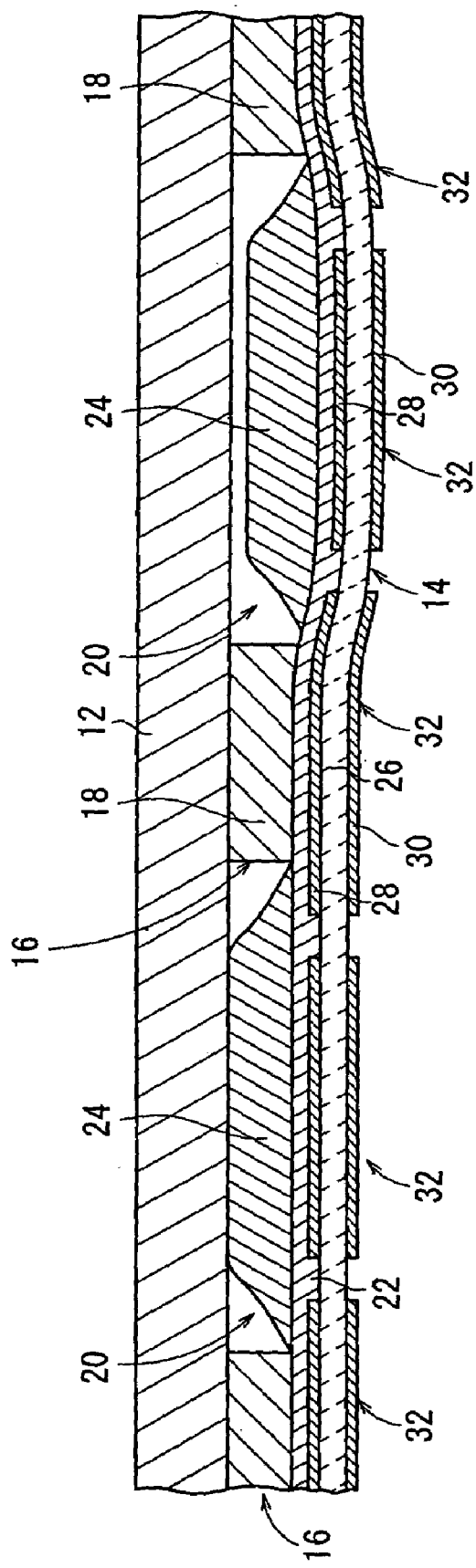
FIG. 9 is a cross-sectional view, partly omitted from illustration, showing a second modification of the actuator element according to the first embodiment.

As shown in FIG. 9, an actuator element 10Ab according to a second modification differs in that it has upper electrodes 28 and lower electrodes 30 which are formed on portions of the piezoelectric/electrostrictive body 14 which correspond to the beams 16 and portions of the piezoelectric/electrostrictive body 14 which correspond to the drive regions 20.

For bringing the upper end face of the displacement transmitter 24 into contact with the lower surface of the plate member 12, no drive voltage is applied between the upper electrodes 28 and lower electrodes 30 which are formed on each portion corresponding to the beams 16, but a drive voltage of positive polarity (e.g., a voltage of +25 V, for example, with respect to the lower electrode 30) may be applied between the upper electrode 28 and the lower electrode 30 which are formed on a portion corresponding to the drive region 20.

Conversely, for spacing the upper end face of the displacement transmitter 24 from the lower surface of the plate member 12, no drive voltage is applied between the upper electrode 28 and lower electrode 30 which are formed on the portion corresponding to the drive region 20, but a drive voltage of positive polarity may be applied between the upper electrodes 28 and the lower electrodes 30 which are formed on each portion corresponding to the beams 16.

According to the first embodiment (see FIG. 1), when the application of the drive voltage is stopped, the displacement transmitter 24 is brought into contact with the plate member 12 only under repelling forces from the piezoelectric/electrostrictive body 14, the displacement transmitter 24, etc. According to the second modification, since the drive force of the actuator unit 32 on the portion corresponding to the drive region 20 can also be used, the upper end face of the displacement transmitter 24 can reliably be brought into contact with the lower surface of the plate member 12.

In the second modification, the upper electrodes 28 may be turned into a common structure or the lower electrodes 30 may be turned into a common structure. Turning the upper electrodes 28 into a common structure includes electrically connecting upper electrodes 28 formed on portions corresponding to the beams 16 or electrically connecting upper electrodes 28 formed on portions corresponding to the drive regions 20, or forming one upper electrode 28 on the entire upper surface of the piezoelectric/electrostrictive layer 26. Turning the lower electrodes 30 into a common structure includes electrically connecting lower electrodes 30 formed on portions corresponding to the beams 16, electrically connecting lower electrodes 30 formed on portions corresponding to the drive regions 20, or forming one lower electrode 30 on the entire upper surface of the piezoelectric/electrostrictive layer 26.

As with FIGS. 6 and 8, a plurality of actuator units 32 may be provided in association with one beam 16, or a plurality of actuator units 32 may be provided in association with one drive region 20.

An actuator element 10B according to a second embodiment will be described below with reference to FIG. 10.

Figure 10:
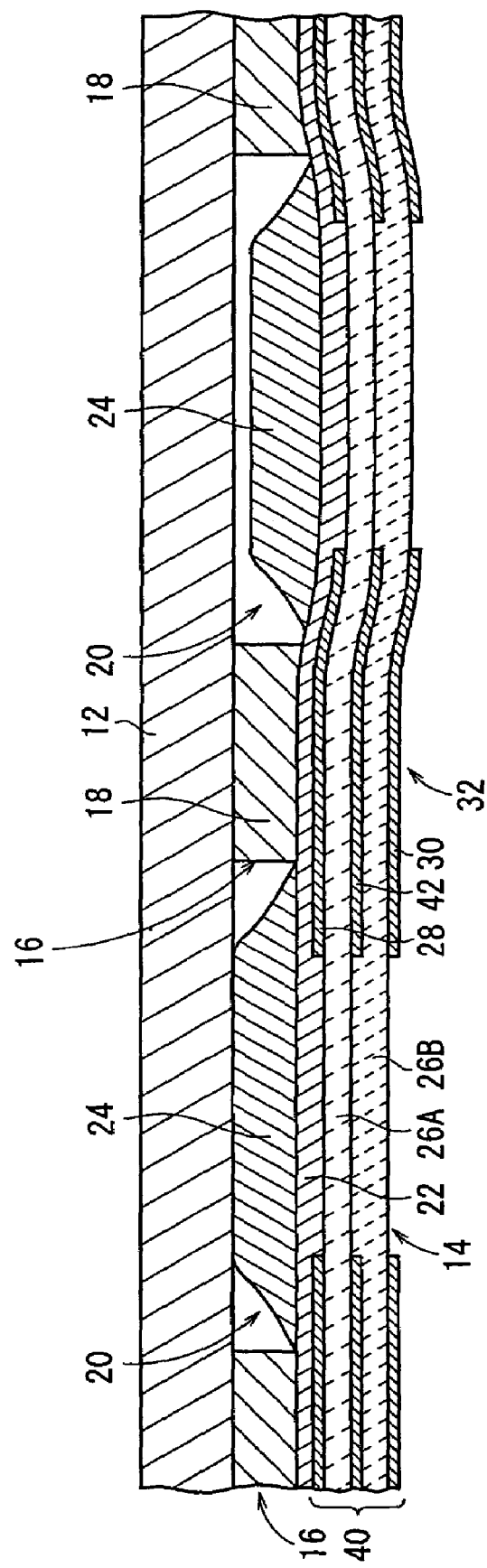
FIG. 10 is a cross-sectional view, partly omitted from illustration, of an actuator element according to a second embodiment.

As shown in FIG. 10, the actuator element 10B according to the second embodiment is closely similar to the actuator element 10A according to the first embodiment, but differs therefrom in that the piezoelectric/electrostrictive body 14 has a laminated assembly 40 of two piezoelectric/electrostrictive layers (first and second piezoelectric/electrostrictive layers 26A, 26B), upper electrodes 28 formed on the upper surface (the surface facing the plate member 12) of the laminated assembly 40, lower electrodes 30 formed on the lower surface (the surface opposite to the surface facing the plate member 12) of the laminated assembly 40, and intermediate electrodes 42 formed between the first and second piezoelectric/electrostrictive layers 26A, 26B.

In the piezoelectric/electrostrictive body 14 of this embodiment, one upper electrode 28, one intermediate electrode 42, one lower electrode 30, and a portion of each of the piezoelectric/electrostrictive layers 26A, 26B that is sandwiched between these upper, intermediate, and lower electrodes 28, 42, 30 function as one actuator unit 32. The intermediate electrodes 42 may be made of the same material as the material of the upper electrodes 28 and the lower electrodes 30 as described above.

Figure 11:
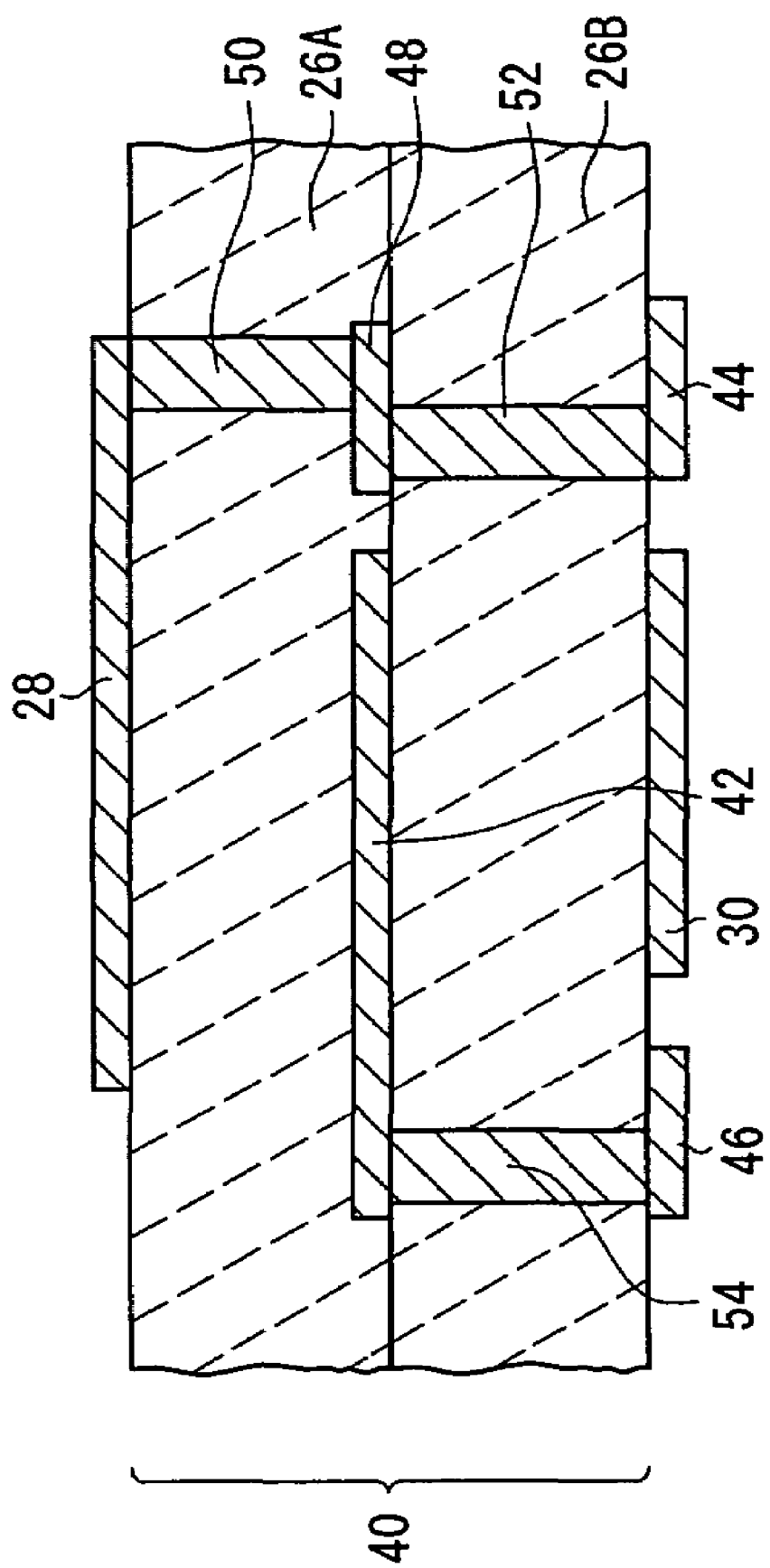
FIG. 11 is a cross-sectional view of an example of an interconnected pattern of an upper electrode, an intermediate electrode, and a lower electrode.

According to an interconnected pattern of the upper electrode 28, the intermediate electrode 42, and the lower electrode 30, as shown in FIG. 11, for example, a terminal 44 for the upper electrode 28 and a terminal 46 for the intermediate electrode 42 are formed on the lower surface of the second piezoelectric/electrostrictive layer 26B separately from the lower electrode 30, and a relay electrode 48 for the upper electrode 28 is formed between the first piezoelectric/electrostrictive layer 26A and the second piezoelectric/electrostrictive layer 26B. The upper electrode 28 and the relay electrode 48 are electrically connected to each other through a through hole 50 that is formed in the first piezoelectric/electrostrictive layer 26A. The relay electrode 48 and the terminal 44 are electrically connected to each other through a through hole 52 that is formed in the second piezoelectric/electrostrictive layer 26B. The intermediate electrode 42 and the terminal 46 are electrically connected to each other through a through hole 54 that is formed in the second piezoelectric/electrostrictive layer 26B. In FIG. 11, the lower electrode 30 doubles as a terminal. Alternatively, this terminal (the terminal for the lower electrode 30) may be formed on the same surface at a position separate from the lower electrode 30.

A driving process for the actuator element 10B according to the second embodiment will be described below.

When the piezoelectric/electrostrictive body 14 is in a natural state, the upper end faces of the displacement transmitters 24 are held in contact with the lower surface of the plate member 12.

A drive voltage of positive polarity (e.g., a voltage of +25 V, for example, with respect to the intermediate electrodes 42) is applied between the upper electrodes 28 and the intermediate electrodes 42 of the actuator units 32 that are formed around a certain drive region 20 (e.g., the right drive region 20 in FIG. 10), and a drive voltage of positive polarity (e.g., a voltage of +25 V, for example, with respect to the intermediate electrodes 42) is applied between the lower electrodes 30 and the intermediate electrodes 42. The peripheral portion of the drive region 20 tends to be flexurally displaced so as to be convex toward the plate member 12. However, since the flexural displacement is suppressed by the spacers 18 and the plate member 12, the energy produced at this time is transmitted to the portion of the piezoelectric/electrostrictive body 14 which corresponds to the drive region 20. Therefore, as shown in FIG. 10, that portion of piezoelectric/electrostrictive body 14 is flexurally displaced so as to be convex downwardly, causing the upper end face of the displacement transmitter 24 in the drive region 20 to be spaced from the plate member 12.

When the application of the above drive voltage is stopped, the portion of the piezoelectric/electrostrictive body 14 which corresponds to the drive region 20 is displaced back to its original state, allowing the upper end face of the displacement transmitter 24 to contact the plate member 12 again.

According to the above driving process, a drive voltage of positive polarity is applied between the upper electrodes 28 and the intermediate electrodes 42 that sandwich the first piezoelectric/electrostrictive layer 26A and also between the lower electrodes 30 and the intermediate electrodes 42 that sandwich the second piezoelectric/electrostrictive layer 26B to space the upper end face of the displacement transmitter 24 from the plate member 12 (first driving process). Alternatively, a drive voltage of positive polarity may be applied only between the upper electrodes 28 and the intermediate electrodes 42 that sandwich the first piezoelectric/electrostrictive layer 26A (second driving process), or a drive voltage of positive polarity may be applied only between the lower electrodes 30 and the intermediate electrodes 42 that sandwich the second piezoelectric/electrostrictive layer 26B (third driving process). Though the first through third driving processes perform similar operations, the displacement produced by the first driving process is the greatest, the displacement produced by the third driving process is the second greatest, and the displacement produced by the second driving process is the smallest, if the drive voltage is the same. Therefore, the actuator element can be driven at a low voltage if the first driving process or the third driving process is employed.

Alternatively, a drive voltage of opposite polarity (e.g., a voltage of −25 V, for example, with respect to the intermediate electrodes 42) may be applied between the upper electrodes 28 and the intermediate electrodes 42 and/or between the lower electrodes 30 and the intermediate electrodes 42, or the direction of polarization of the first and second piezoelectric/electrostrictive layers 26A, 26B or the voltage value may be varied. In this case, the portion of the piezoelectric/electrostrictive body 14 which corresponds to the drive region 20 is flexurally displaced so as to be convex toward the plate member 12, causing the upper end face of the displacement transmitter 24 to strongly press the lower surface of the plate member 12.

The actuator element 10B according to the second embodiment as described above is capable of achieving a parallel-type drive mode to obtain a desired displacement without using vibration plates, and can be made lower in profile, lighter in weight, and lower in cost. Particularly, because the piezoelectric/electrostrictive layers included in the piezoelectric/electrostrictive body 14 are of a dual-layer structure (the first and second piezoelectric/electrostrictive layers 26A, 26B), each of the first and second piezoelectric/electrostrictive layers 26A, 26B can be thinned, with the results that a high electric field can be applied under a low voltage for producing a large driving force and displacement.

As shown in FIG. 11, as each upper electrode 28 and each intermediate electrode 42 are connected to the lower surface of the laminated assembly 40 through the through holes 50, 52, 54 formed in the laminated assembly 40, the upper electrodes 28 and the intermediate electrodes 42 formed on the laminated assembly 40 can easily be connected (signals can easily be supplied), and can easily be wired to a drive circuit (not shown).

The intermediate electrodes 42 may be turned into a common structure. Turning the intermediate electrodes 42 into a common structure includes electrically connecting intermediate electrodes 42 or forming one intermediate electrode 42 on the entire upper surface of the second piezoelectric/electrostrictive layer 26B. By turning the intermediate electrodes 42 into a common structure, the fabrication process can be simplified, and the wiring can be facilitated. The waveform of the drive voltage can also be simplified, and the drive circuit system can be simplified.

Figure 12:
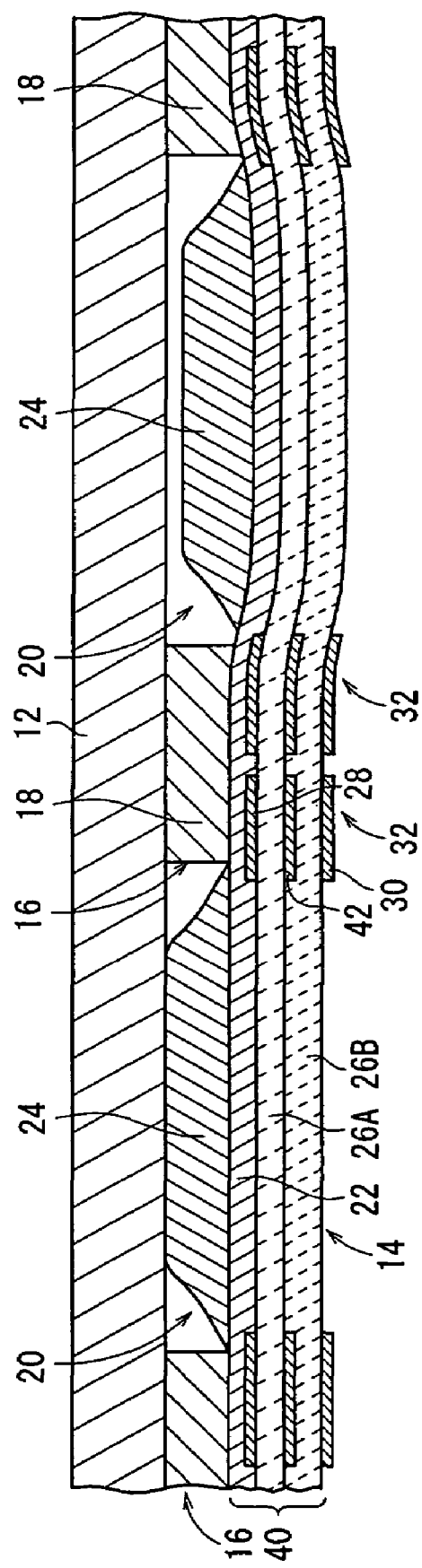
FIG. 12 is a cross-sectional view, partly omitted from illustration, showing an example in which a plurality of actuator units are provided in association with one beam, according to the second embodiment.

The actuator element 10B according to the second embodiment can employ a structure in which a plurality of actuator units 32 are provided in association with one beam 16, as shown in FIG. 12.

Some modifications of the actuator element 10B according to the second embodiment will be described below with reference to FIGS. 13 and 14. Those parts which correspond to those shown in FIG. 10 are denoted by identical reference characters, and will not be described overlappingly.

Figure 13:
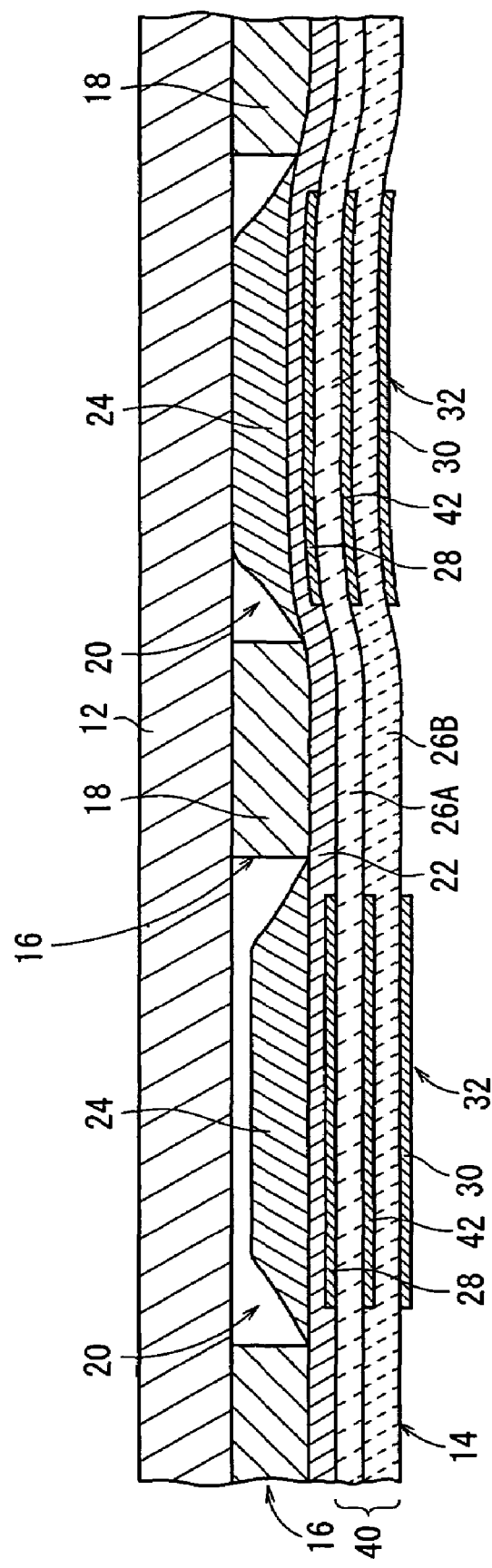
FIG. 13 is a cross-sectional view, partly omitted from illustration, showing a first modification of the actuator element according to the second embodiment.

As shown in FIG. 13, an actuator element 10Ba according to a first modification differs in that it has upper electrodes 28, intermediate electrodes 42, and lower electrodes 30 which are formed on portions of the piezoelectric/electrostrictive body 14 which correspond to the drive regions 20.

An example of a driving process will be described below. While the piezoelectric/electrostrictive body 14 is in a natural state, each upper end face of the displacement transmitters 24 is spaced from the lower surface of the plate member 12.

A drive voltage of positive polarity is applied between the upper electrode 28 and the intermediate electrode 42 of the actuator unit 32 that corresponds to a certain drive region 20 (e.g., the right drive region 20 in FIG. 13), and a drive voltage of positive polarity is applied between the lower electrode 30 and the intermediate electrode 42. The portion of the piezoelectric/electrostrictive body 14 which corresponds to the drive region 20 is flexurally displaced so as to be convex toward the plate member 12. The displacement is transmitted to the displacement transmitter 24, and the upper end face of the displacement transmitter 24 is brought into contact with the lower surface of the plate member 12, as shown in FIG. 13.

When the application of the above drive voltage is stopped, the actuator unit 32 of the drive region 20 is displaced back to its original state, spacing the upper end face of the displacement transmitter 24 from the plate member 12.

According to the above driving process, a drive voltage of positive polarity is applied between the upper electrode 28 and the intermediate electrode 42 that sandwich the first piezoelectric/electrostrictive layer 26A and also between the lower electrode 30 and the intermediate electrode 42 that sandwich the second piezoelectric/electrostrictive layer 26B to bring the upper end face of the displacement transmitter 24 into contact with the plate member 12 (fourth driving process). Alternatively, a drive voltage of positive polarity may be applied only between the upper electrode 28 and the intermediate electrode 42 that sandwich the first piezoelectric/electrostrictive layer 26A (fifth driving process), or a drive voltage of positive polarity may be applied only between the lower electrode 30 and the intermediate electrode 42 that sandwich the second piezoelectric/electrostrictive layer 26B (sixth driving process). Though the fourth through sixth driving processes perform similar displacing operations, the displacement produced by the fourth driving process is the greatest, the displacement produced by the sixth driving process is the second greatest, and the displacement produced by the fifth driving process is the smallest, if the drive voltage is the same. Therefore, the actuator element can be driven at a low voltage if the fourth driving process or the sixth driving process is employed.

Alternatively, a drive voltage of opposite polarity (e.g., a voltage of −25 V, for example, with respect to the intermediate electrode 42) may be applied between the upper electrode 28 and the intermediate electrode 42 and/or between the lower electrode 30 and the intermediate electrode 42, or the direction of polarization of the first and second piezoelectric/electrostrictive layers 26A, 26B or the voltage value may be varied. In this case, the portion of the piezoelectric/electrostrictive body 14 which corresponds to the drive region 20 is flexurally displaced so as to be concave toward the plate member 12, causing the upper end face of the displacement transmitter 24 to be spaced from the lower surface of the plate member 12.

Figure 14:
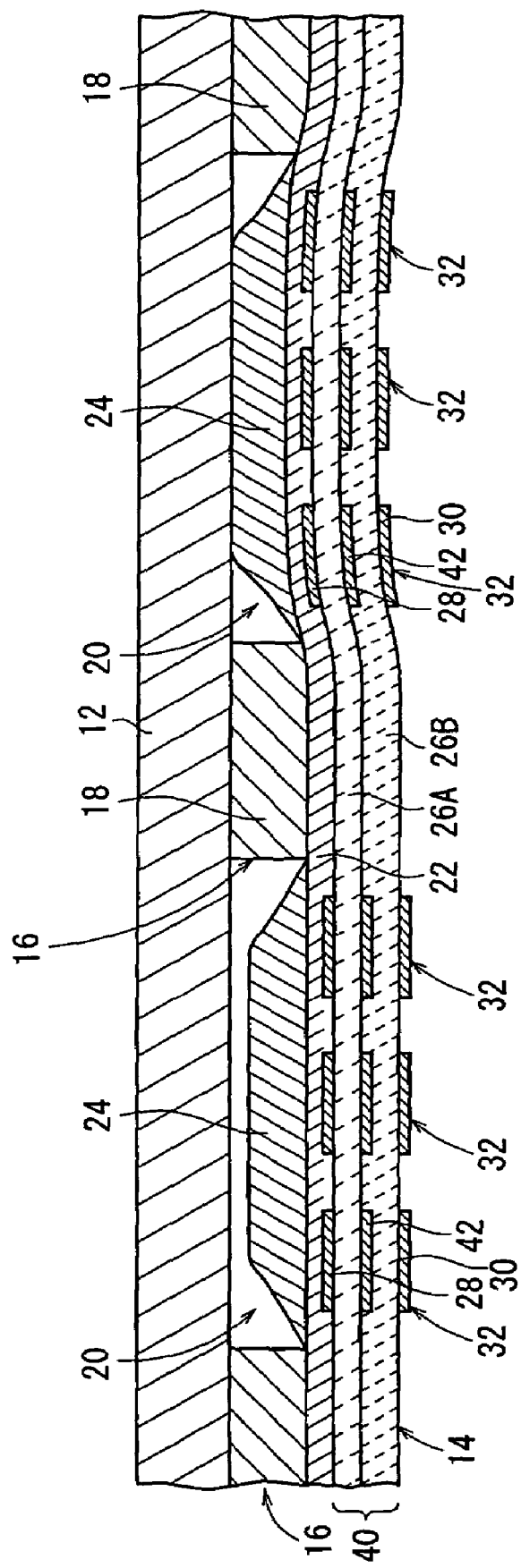
FIG. 14 is a cross-sectional view, partly omitted from illustration, showing an example in which a plurality of actuator units are provided in association with one drive region, in the first modification according to the second embodiment.

According to the first modification, as shown in FIG. 14, a plurality of actuator units 32 may be provided in association with one drive region 20. The intermediate electrodes 42 may be turned into a common structure.

Figure 15:
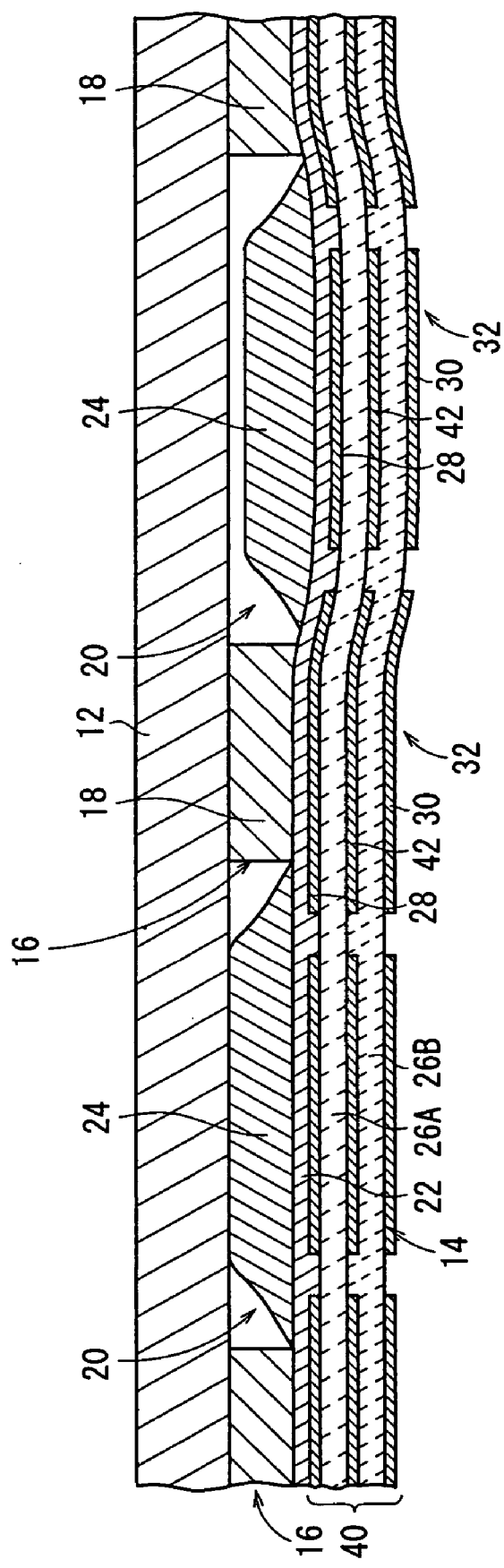
FIG. 15 is a cross-sectional view, partly omitted from illustration, showing a second modification of the actuator element according to the second embodiment.

As shown in FIG. 15, an actuator element 10Bb according to a second modification differs in that it has upper electrodes 28, intermediate electrodes 42, and lower electrodes 30 which are formed on portions of the piezoelectric/electrostrictive body 14 which correspond to the beams 16 and portions of the piezoelectric/electrostrictive body 14 which correspond to the drive regions 20.

For bringing the upper end face of the displacement transmitter 24 into contact with the lower surface of the plate member 12, no drive voltage is applied between the upper electrodes 28 and the intermediate electrodes 42 and between the lower electrodes 30 and the intermediate electrodes 42 which are formed on a portion corresponding to the beams 16, but a drive voltage of positive polarity may be applied between the upper electrode 28 and the intermediate electrode 42 and/or between the lower electrode 30 and the intermediate electrode 42 which are formed on a portion corresponding to the drive region 20.

For spacing the upper end face of the displacement transmitter 24 from the lower surface of the plate member 12, no drive voltage is applied between the upper electrode 28 and the intermediate electrode 42 and between the lower electrode 30 and the intermediate electrode 42 which are formed on the portion corresponding to the drive region 20, but a drive voltage of positive polarity may be applied between the upper electrodes 28 and the intermediate electrodes 42 and/or between the lower electrodes 30 and the intermediate electrodes 42 which are formed on the portions corresponding to the beams 16.

In FIG. 10, when the application of the drive voltage is stopped, the displacement transmitter 24 is brought into contact with the plate member 12 only under repelling forces from the piezoelectric/electrostrictive body 14, the displacement transmitter 24, etc. According to the second modification, since the drive force of the actuator unit 32 on the portion corresponding to the drive region 20 can also be used, the upper end face of the displacement transmitter 24 can reliably be brought into contact with the lower surface of the plate member 12.

In the second modification, the intermediate electrodes 42 may be turned into a common structure. Turning the intermediate electrodes 42 into a common structure includes electrically connecting intermediate electrodes 42 formed on portions corresponding to the beams 16 or electrically connecting intermediate electrodes 42 formed on portions corresponding to the drive regions 20, or forming one intermediate electrode 42 on the entire upper surface of the second piezoelectric/electrostrictive layer 26B.

As with FIGS. 12 and 14, a plurality of actuator units 32 may be provided in association with one beam 16, or a plurality of actuator units 32 may be provided in association with one drive region 20.

An embodiment in which the actuator element 10B according to the second embodiment is applied to a display device will be described below with reference to FIG. 16.

Figure 16:
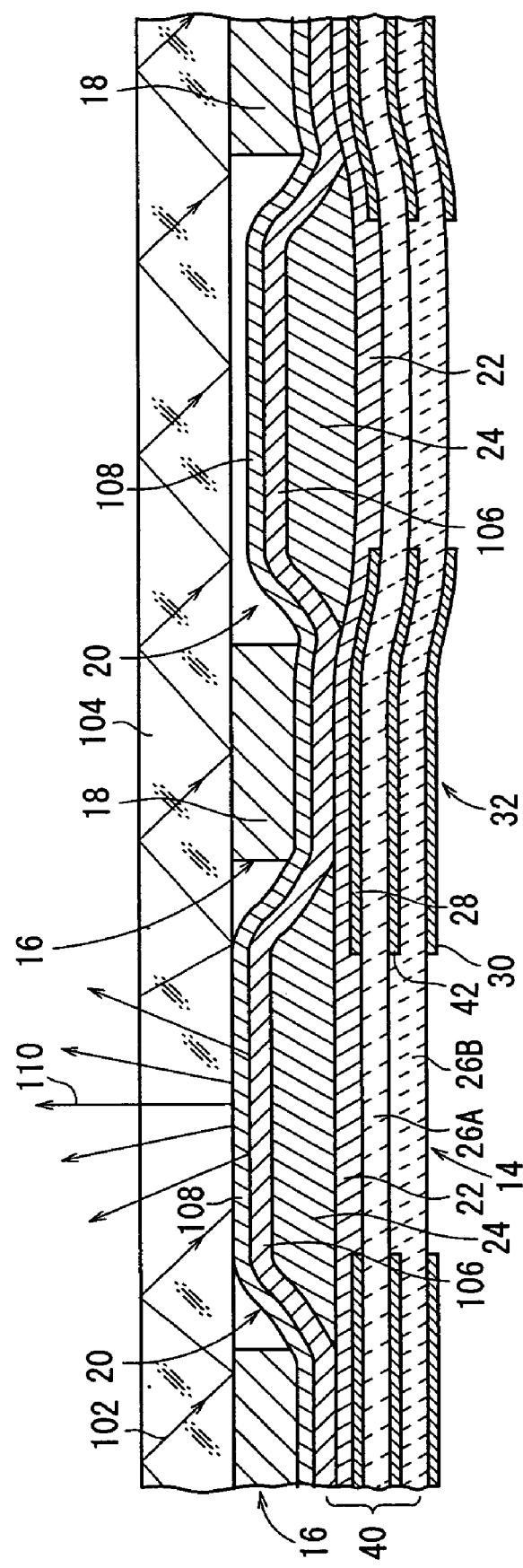
FIG. 16 is a cross-sectional view, partly omitted from illustration, of a display apparatus according to an embodiment.
Figure 17:
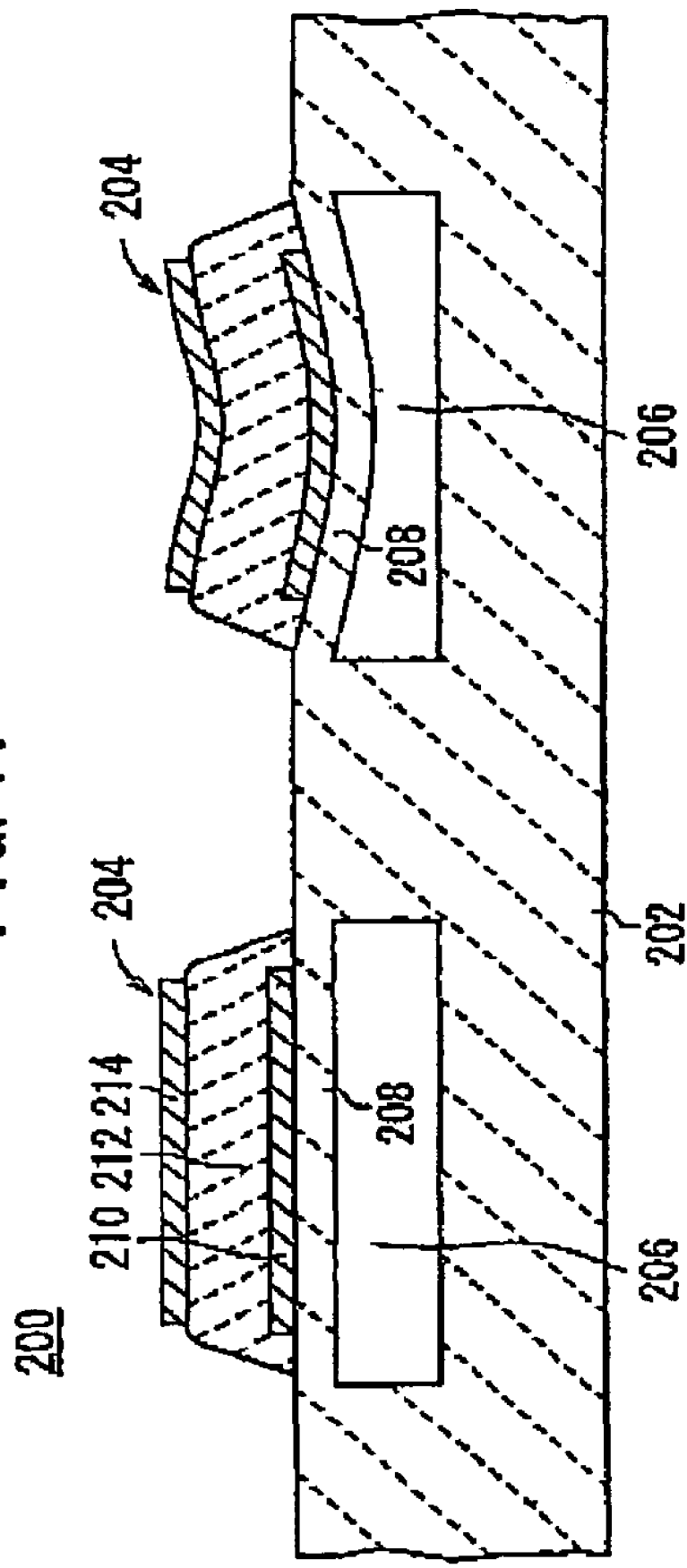
FIG. 17 is a cross-sectional view, partly omitted from illustration, of a conventional actuator element.

As shown in FIG. 16, a display device 100 according to the present embodiment employs an optical waveguide plate 104 as the plate member 12 into which light (introduced light) 102 from a light source (not shown) is introduced from an end face thereof.

A joining layer 22 is formed on the entire upper surface of the piezoelectric/electrostrictive body 14, and the displacement transmitters 24 are formed on the upper surface of the joining layer 22 in association with the respective drive regions 20. A light scattering layer 108 is formed so as to wholly overlap the displacement transmitters 24 and the joining layer 22 through a joining layer 106. The spacers 18 are disposed in portions where the beams 16 are to be disposed, in a region between the optical waveguide plate 104 and the piezoelectric/electrostrictive body 14. The spacers 18 have upper surfaces held in contact with the optical waveguide plate 104 and lower surfaces held in contact with the light scattering layer 108.

Each beam 16 includes one spacer 18 disposed between the optical waveguide plate 104 and the piezoelectric/electrostrictive body 14, a portion of the light scattering layer 108 and portions of the joining layers 106, 22 which are present directly beneath the spacer 18. The drive regions 20 divided by the beams 16 are arranged in a matrix or staggered pattern, making a single pixel of a single drive region 20 or making a single pixel of a plurality of drive regions 20. Each spacer 18 may be constructed of a light absorbing layer. Each spacer 18 may be constructed of another member, and a light absorbing layer may be interposed between the spacers 18 and the optical waveguide plate 104.

Operation of the display device 100 according to the present embodiment will be described below. While the piezoelectric/electrostrictive body 14 is in a natural state, the end face of the light scattering layer 108 contacts the back of the optical waveguide plate 104 by a distance equal to or smaller than the wavelength of the introduced light 100 (the light introduced into the optical waveguide plate). Therefore, white light 110, for example, is emitted from the principal surface of the optical waveguide plate 104.

Then, a drive voltage of positive polarity is applied between the upper electrodes 28 and the intermediate electrodes 42 that are formed around a certain drive region 20 (e.g., the right drive region 20 in FIG. 16), and a drive voltage of positive polarity is applied between the lower electrodes 30 and the intermediate electrodes 42. The peripheral portion of the drive region 20 tends to be flexurally displaced so as to be convex toward the optical waveguide plate 104. However, since the flexural displacement is suppressed by the spacers 18 and the optical waveguide plate 104, the energy produced at this time is transmitted to the portion of the piezoelectric/electrostrictive body 14 which corresponds to the drive region 20. Therefore, as shown in FIG. 16, that portion of the piezoelectric/electrostrictive body 14 is flexurally displaced so as to be convex downwardly, extinguishing light from the drive region 20.

Since the display device 100 according to the present embodiment employs the actuator element 10B according to the second embodiment, the display apparatus 100 can be made lower in profile, lighter in weight, and lower in cost.

Each beam 16 includes buffer layers. Specifically, the joining layers 106, 22 are interposed between the light scattering layer 108 directly beneath the spacers 18 and the piezoelectric/electrostrictive body 14. If the spacers 18 are made of a hard material, and a thin film such as the light scattering layer 108 is formed on the lower surfaces of the spacers 18, stresses tend to concentrate on portions of the light scattering layer 108 (boundaries between itself and the spacers 18), causing the light scattering layer 108 to be broken due to repeated displacement of the piezoelectric/electrostrictive body 14. According to the present embodiment, the joining layers 106, 22 that are interposed function as buffer layers to avoid the above drawback.

The actuator elements 10A, 10B according to the first and second embodiments (including the various modifications) may be used for a device for converting electric energy into mechanical energy (mechanical displacement, stress, vibration, or the like), such as a display, a relay, an actuator (an actuator of the type for generating flexural displacement, for use in a servo displacement device or the like), or the like, or a device for converting mechanical energy into electric energy, such as a sensor (a filter, an acceleration sensor, a shock sensor, or the like), a transformer, a microphone, a sound producing member (a speaker or the like), a vibrator, an oscillator (for power or communication use), a micropump, or a highly sensitive electric transducer module (electric generator).

The actuator element and the device employing the actuator element according to the present invention are not limited to the above embodiments, but may incorporate various structures without departing from the essential features of the present invention.

What is claimed is:

1. An actuator element comprising:
   a plate member;
   a piezoelectric/electrostrictive body disposed in facing relation to said plate member; and
   a beam disposed between said plate member and said piezoelectric/electrostrictive body and fixing said piezoelectric/electrostrictive body to said plate member;
   said piezoelectric/electrostrictive body having a piezoelectric/electrostrictive layer that overlaps an entirety of said beam, an upper electrode formed on a surface of said piezoelectric/electrostrictive layer which faces said plate member, and a lower electrode formed on a surface of said piezoelectric/electrostrictive layer which is opposite to the surface thereof facing said plate member;
   whereby when an electric field is applied to said upper electrode and said lower electrode, a portion of said piezoelectric/electrostrictive body is displaced toward or away from said plate member.

2. An actuator element according to claim 1, wherein said upper electrode and said lower electrode are formed on a portion of said piezoelectric/electrostrictive body which corresponds to said beam.

3. An actuator element according to claim 1, wherein a region disposed between said plate member and said piezoelectric/electrostrictive body and divided by said beam serves as a drive region, and said upper electrode and said lower electrode are formed on a portion of said piezoelectric/electrostrictive body which corresponds to said drive region.

4. An actuator element according to claim 1, wherein a region disposed between said plate member and said piezoelectric/electrostrictive body and divided by said beam serves as a drive region, and said upper electrode and said lower electrode are formed on a portion of said piezoelectric/electrostrictive body which corresponds to said beam and a portion of said piezoelectric/electrostrictive body which corresponds to said drive region.

5. An actuator element according to claim 1, wherein said upper electrode is connected to the surface of said piezoelectric/electrostrictive layer on which said lower electrode is formed, through a through hole formed in said piezoelectric/electrostrictive layer.

6. An actuator element according to claim 1, wherein said piezoelectric/electrostrictive body comprises a laminated assembly of piezoelectric/electrostrictive layers, an upper electrode formed on a surface of said laminated assembly which faces said plate member, a lower electrode formed on a surface of said laminated assembly which is opposite to the surface thereof facing said plate member, and an intermediate electrode formed in said laminated assembly between said piezoelectric/electrostrictive layers.

7. An actuator element according to claim 6, wherein said upper electrode, said intermediate electrode, and said lower electrode are formed on a portion of said piezoelectric/electrostrictive body which corresponds to said beam.

8. An actuator element according to claim 6, wherein a region disposed between said plate member and said piezoelectric/electrostrictive body and divided by said beam serves as a drive region, and said upper electrode, said intermediate electrode, and said lower electrode are formed on a portion of said piezoelectric/electrostrictive body which corresponds to said drive region.

9. An actuator element according to claim 6, wherein a region disposed between said plate member and said piezoelectric/electrostrictive body and divided by said beam serves as a drive region, and said upper electrode, said intermediate electrode, and said lower electrode are formed on a portion of said piezoelectric/electrostrictive body which corresponds to said beam and a portion of said piezoelectric/electrostrictive body which corresponds to said drive region.

10. An actuator element according to claim 6, wherein said upper electrode and said intermediate electrode are connected to the surface of said laminated assembly on which said lower electrode is formed, via through holes formed in said laminated assembly.

11. An actuator element according to claim 1, further comprising:
    a displacement transmitter for transmitting displacement of said piezoelectric/electrostrictive body to said plate member in a region disposed between said plate member and said piezoelectric/electrostrictive body and divided by said beam.

12. An actuator element according to claim 11, wherein said plate member comprises a transparent plate into which light is introduced, further comprising at least a light scattering layer disposed on said displacement transmitter.

13. An actuator element according to claim 1, further comprising:
   a spacer disposed between said plate member and said piezoelectric/electrostrictive body;
   wherein said plate member is held in contact with an upper surface of said spacer and said piezoelectric/electrostrictive body is held in contact with a lower surface of said spacer, said beam including said spacer.

14. An actuator element according to claim 1, further comprising:
   a spacer disposed between said plate member and said piezoelectric/electrostrictive body;
   wherein at least one-layer film is formed between a lower surface of said spacer and said piezoelectric/electrostrictive body, said beam including said spacer and a portion of said film directly beneath said spacer.

15. An actuator element according to claim 1, wherein said beam includes a buffer layer.

16. A device having an actuator element according to claim 1.

* * * * *